(12) United States Patent
Li et al.

(10) Patent No.: US 12,317,718 B2
(45) Date of Patent: May 27, 2025

(54) DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventors: Yansong Li, Beijing (CN); Ying Bao, Beijing (CN); Haidong Wu, Beijing (CN); Xing Fan, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 419 days.

(21) Appl. No.: 17/778,891

(22) PCT Filed: Mar. 5, 2021

(86) PCT No.: PCT/CN2021/079281
§ 371 (c)(1),
(2) Date: May 23, 2022

(87) PCT Pub. No.: WO2021/175312
PCT Pub. Date: Sep. 10, 2021

(65) Prior Publication Data
US 2023/0006004 A1 Jan. 5, 2023

(30) Foreign Application Priority Data
Mar. 5, 2020 (CN) .......................... 202010148067.5

(51) Int. Cl.
*H10K 59/35* (2023.01)
*H10K 59/121* (2023.01)
(Continued)

(52) U.S. Cl.
CPC ......... *H10K 59/353* (2023.02); *H10K 59/121* (2023.02); *H10K 59/122* (2023.02);
(Continued)

(58) Field of Classification Search
CPC .... H10K 59/353; H10K 59/352; H10K 59/65; H10K 71/00; H10K 59/875; H10K 59/121; H10K 59/122; H10K 59/80522
See application file for complete search history.

(56) References Cited

U.S. PATENT DOCUMENTS

| | | |
|---|---|---|
| 2008/0157654 A1 | 7/2008 | Cok |
| 2016/0087245 A1* | 3/2016 | Park ..................... H10K 50/856 257/40 |

(Continued)

FOREIGN PATENT DOCUMENTS

| | | |
|---|---|---|
| CN | 104851903 A | 8/2015 |
| CN | 109904347 A | 6/2019 |

(Continued)

OTHER PUBLICATIONS

The First Office Action for the Chinese Patent Application No. 202010148067.5 issued by the Chinese Patent Office on Mar. 30, 2022.

(Continued)

*Primary Examiner* — David Vu
*Assistant Examiner* — Brandon C Fox
(74) *Attorney, Agent, or Firm* — XSENSUS LLP

(57) ABSTRACT

A display substrate has a display region. The display region includes at least a first region, and the first region includes a plurality of first sub-pixel regions. The display substrate includes: a substrate; a plurality of first sub-pixels disposed on a side of the substrate; and a pattern layer disposed on a side of the plurality of first sub-pixels away from the substrate. The pattern layer includes a first pattern and a plurality of second patterns. Boundaries of orthographic projections of part of the second patterns located in the first region on the substrate respectively coincide with boundaries of the first sub-pixel regions; or boundaries of the first sub-pixel regions are respectively located within boundaries (Continued)

of orthographic projections of part of the second patterns located in the first region on the substrate. A portion of the first pattern located in the first region is electrically connected to the first cathode.

19 Claims, 9 Drawing Sheets

(51) Int. Cl.
*H10K 59/122* (2023.01)
*H10K 59/65* (2023.01)
*H10K 59/80* (2023.01)
*H10K 71/00* (2023.01)

(52) U.S. Cl.
CPC .......... *H10K 59/352* (2023.02); *H10K 59/65* (2023.02); *H10K 59/875* (2023.02); *H10K 71/00* (2023.02)

(56) References Cited

U.S. PATENT DOCUMENTS

2021/0134900 A1* 5/2021 Jiang ................ H10K 59/80522
2021/0217989 A1 7/2021 Gao et al.
2022/0093892 A1 3/2022 Liu

FOREIGN PATENT DOCUMENTS

CN 109950415 A * 6/2019
CN 110649179 A 1/2020

OTHER PUBLICATIONS

The Second Office Action for the Chinese Patent Application No. 202010148067.5 issued by the Chinese Patent Office on Aug. 12, 2022.

* cited by examiner

DISPLAY SUBSTRATE AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN 2021/079281 filed on Mar. 5, 2021, which claims priority to Chinese Patent Application No. 202010148067.5, filed on Mar. 5, 2020, which are incorporated herein by reference in their entirety.

TECHNICAL FIELD

The present disclosure relates to the field of display technologies, and in particular, to a display substrate and a manufacturing method therefor, and a display apparatus.

BACKGROUND

Organic light-emitting diodes (OLEDs) are attracting much attention due to their advantages of high brightness, full viewing angle, fast response speed, and flexible display. Active-matrix organic light-emitting diodes (AMOLEDs) are widely used in the display field due to their advantages of low driving voltage and long service life of a light-emitting device.

SUMMARY

In an aspect, a display substrate is provided. The display substrate has a display region. The display region includes at least a first region, and the first region includes a plurality of first sub-pixel regions. The display substrate includes: a substrate; a plurality of first sub-pixels disposed on a side of the substrate and respectively located at the plurality of first sub-pixel regions, each first sub-pixel including a first anode, a first light-emitting layer and a first cathode that are stacked in sequence; and a pattern layer disposed on a side of the plurality of first sub-pixels away from the substrate. The pattern layer includes a first pattern and a plurality of second patterns. The first pattern has a plurality of openings arranged at intervals, and the plurality of second patterns are disposed in the plurality of openings, respectively. The first pattern is made of a conductive material, and the second patterns are made of a transparent insulating material. Boundaries of orthographic projections of part of the plurality of second patterns located in the first region on the substrate respectively coincide with boundaries of the plurality of first sub-pixel regions; or boundaries of the plurality of first sub-pixel regions are respectively located within boundaries of orthographic projections of part of the plurality of second patterns located in the first region on the substrate. A portion of the first pattern located in the first region is electrically connected to the first cathode.

In some embodiments, an orthographic projection of each second pattern on the substrate is at least partially overlapped with an orthogonal projection of a corresponding opening on the substrate.

In some embodiments, the first pattern and the second patterns are mutually exclusive in material.

In some embodiments, the second patterns are made of a lithium quinoline complex, and the first pattern is made of magnesium.

In some embodiments, a side surface of the portion, proximate to the substrate, of the first pattern located in the first region is in direct contact with a side surface of the first cathode away from the substrate.

In some embodiments, a thickness of the portion of the first pattern located in the first region is greater than or equal to 100 nm.

In some embodiments, with respect to the substrate, side surfaces of the plurality of second patterns away from the substrate are lower than a side surface of the first pattern away from the substrate.

In some embodiments, a thickness of the plurality of second patterns is about 5 nm.

In some embodiments, the display region further includes a second region located beside the first region, and the second region includes a plurality of second sub-pixel regions. A portion of the display substrate located between two adjacent second sub-pixel regions is configured to allow light to pass through the display substrate from a side to another opposite side.

In some embodiments, the display substrate further includes a plurality of second sub-pixels disposed on the side of the substrate and respectively located at the plurality of second sub-pixel regions. Each second sub-pixel includes a second anode and a second light-emitting layer that are stacked in sequence. Boundaries of the plurality of second sub-pixel regions are located within an orthographic projection of a portion of the first pattern located in the second region on the substrate, and the second light-emitting layer is electrically connected to the portion of the first pattern located in the second region. Orthographic projections of part of the plurality of second patterns located in the second region on the substrate are non-overlapped with the boundaries of the plurality of second sub-pixel regions.

In some embodiments, a side surface of the portion, proximate to the substrate, of the first pattern located in the second region is in direct contact with a side surface of the second light-emitting layer away from the substrate. The portion of the first pattern located in the second region serves as a second cathode in each second sub-pixel.

In some embodiments, a thickness of a portion of the first pattern located in the second region is in a range of 10 nm to 15 nm, inclusive.

In another aspect, a manufacturing method of a display substrate is provided. The manufacturing method of the display substrate includes: providing a substrate, the substrate having a display region, the display region including at least a first region, and the first region including a plurality of first sub-pixel regions; forming a plurality of first sub-pixels on a side of the substrate, the plurality of first sub-pixels being respectively located at the plurality of first sub-pixel regions, and each first sub-pixel including a first anode, a first light-emitting layer and a first cathode that are stacked in sequence; and forming a pattern layer on a side of the plurality of first sub-pixels away from the substrate. The pattern layer includes a first pattern and a plurality of second patterns, the first pattern has a plurality of openings arranged at intervals, and the plurality of second patterns are disposed in the plurality of openings, respectively. The first pattern is made of a conductive material, and the second patterns are made of a transparent insulating material. Forming the pattern layer on the side of the plurality of first sub-pixels away from the substrate, includes: forming the plurality of second patterns arranged at intervals on the side of the plurality of first sub-pixels away from the substrate; and forming the first pattern in gaps between the plurality of second patterns. Boundaries of orthographic projections of part of the plurality of second patterns located in the first region on the substrate respectively coincide with boundaries of the plurality of first sub-pixel regions; or boundaries of the plurality of first sub-pixel regions are respectively located within boundaries of orthographic projections of part of the plurality of second patterns located in the first region on the substrate. A portion of the first pattern located in the first region is electrically connected to the first cathode.

In some embodiments, forming the plurality of second patterns arranged at intervals on the side of the plurality of first sub-pixels away from the substrate, includes: disposing a fine metal mask on the side of the plurality of first sub-pixels away from the substrate; and evaporating the transparent insulating material onto the side of the plurality of first sub-pixels away from the substrate by an evaporation process using the fine metal mask, so as to form the plurality of second patterns arranged at intervals. Forming the first pattern in the gaps between the plurality of second patterns, includes: disposing an open mask on a side of the plurality of second patterns away from the substrate; and evaporating the conductive material into the gaps between the plurality of second patterns by an evaporation process using the open mask, so as to form the first pattern. The conductive material and the transparent insulating material are mutually exclusive, and a shape of an orthographic projection of the first pattern on the substrate is complementary to shapes of orthographic projections of the plurality of second patterns on the substrate.

In yet another aspect, a display apparatus is provided. The display apparatus includes the display substrate in any one of the above embodiments.

In some embodiments, in a case where the display region of the display substrate further includes a second region, the display apparatus further includes at least one optical sensor disposed on a side of the substrate in the display substrate away from the pattern layer in the display substrate and located in the second region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product and an actual process of a method to which the embodiments of the present disclosure relate.

DETAILED DESCRIPTION

Figure 1:
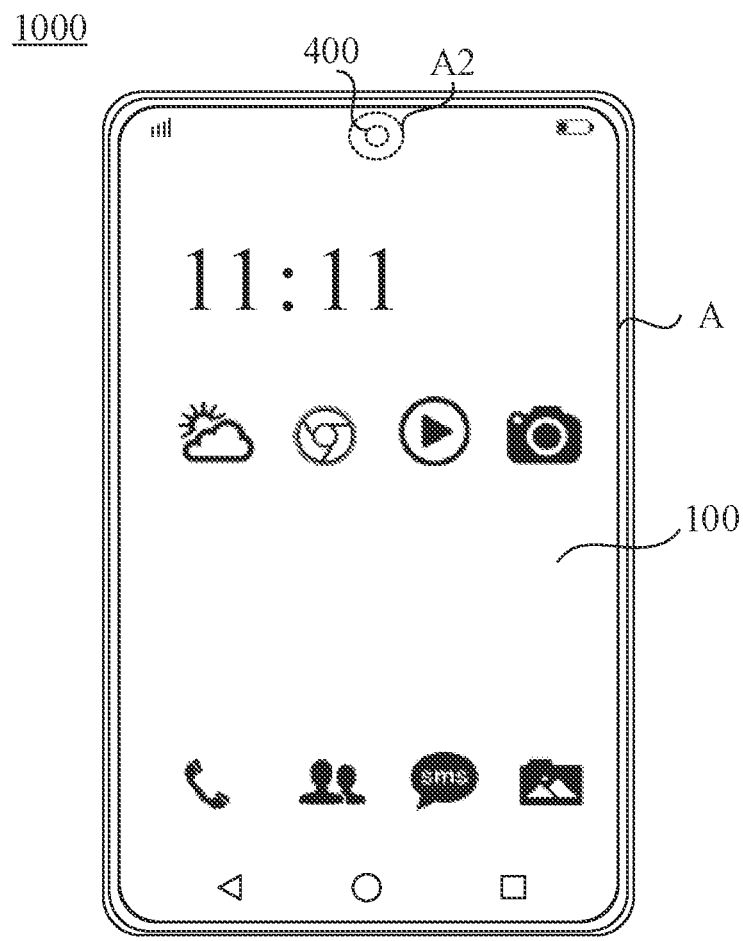
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features.

In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, for a large-sized display panel such as a vehicle-mounted display panel or a notebook, due to a large light-emitting area of the display panel, a large current is required to drive a light-emitting device. On this basis, cathodes of light-emitting devices in an electroluminescent display panel are formed into a whole layer by evaporation (that is, the light-emitting devices share a whole cathode layer). Moreover, in order to ensure a light extraction efficiency of the light-emitting device, the cathode layer is usually made thin, which results in a large sheet resistance of the cathode layer. In this way, a brightness of an end of the electroluminescent display panel proximate to an integrated circuit is higher than a brightness of an end of the electroluminescent display panel away from the integrated circuit, thereby resulting in a non-uniform display.

Figure 5:
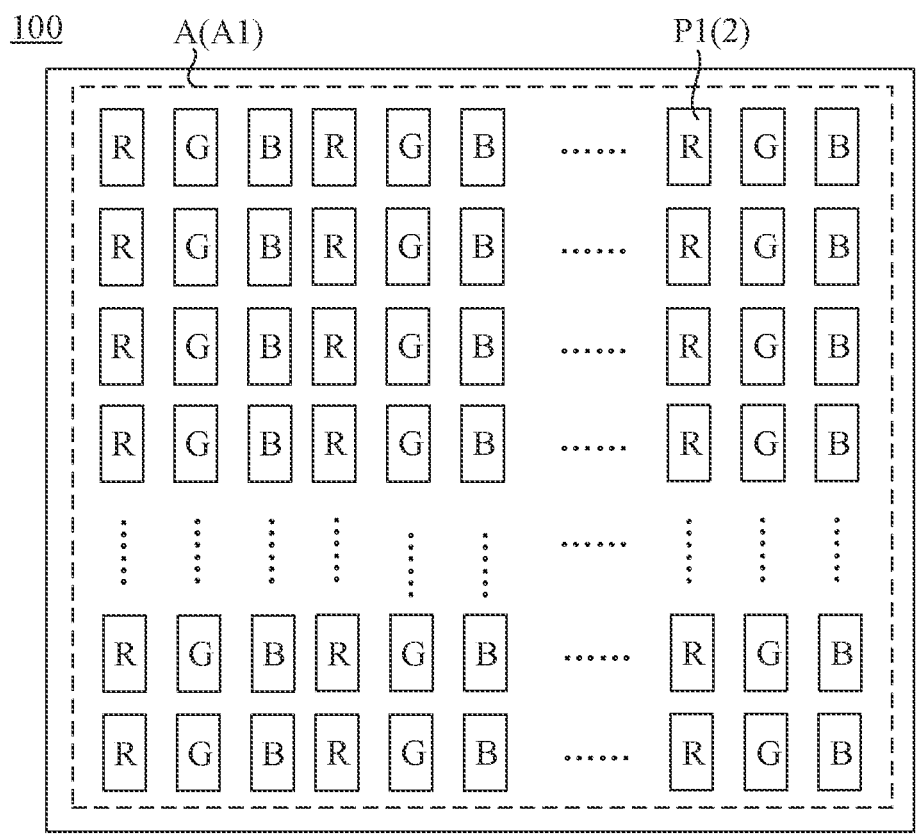
FIG. 5 is a structural diagram of another display substrate, in accordance with some embodiments of the present disclosure.
Figure 6:
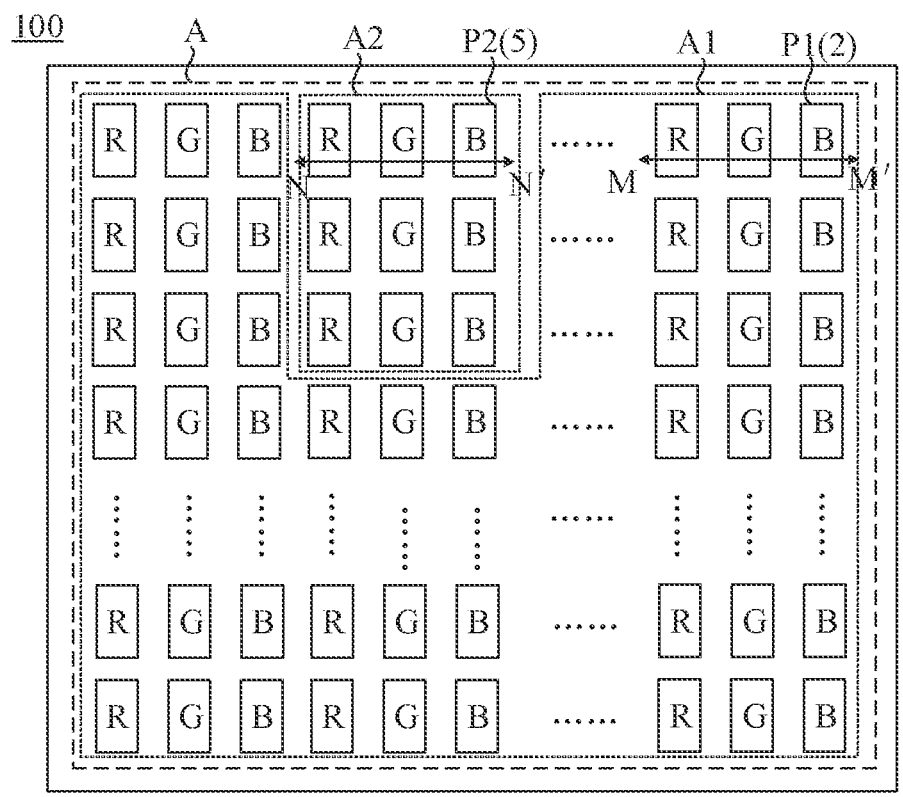
FIG. 6 is a structural diagram of yet another display substrate, in accordance with some embodiments of the present disclosure.

Based on this, some embodiments of the present disclosure provide a display substrate. As shown in FIGS. 5 and 6, the display substrate 100 has a display region A.

For example, the display region A includes at least a first region A1. That is, as shown in FIG. 5, the display region A may include only the first region A1. Alternatively, the display region A may include the first region A1 and other region(s). For example, as shown in FIG. 6, the display region A may include the first region A1 and a second region A2. For the second region A2, reference may be made to a following description, which will not be repeated here.

For example, as shown in FIG. 5, the first region A1 may include a plurality of first sub-pixel regions P1. For example, the plurality of first sub-pixel regions P1 may be arranged in an array.

In some examples, as shown in FIGS. 3 and 7 to 11, the display substrate 100 may include a substrate 1.

A type of the substrate 1 varies, and may be set according to actual needs.

For example, the substrate 1 may be a rigid substrate. The rigid substrate may be a glass substrate or a polymethyl methacrylate (PMMA) substrate.

For example, the substrate 1 may be a flexible substrate. The flexible substrate may be a polyethylene terephthalate (PET) substrate, a polyethylene naphthalate two formic acid glycol ester (PEN) substrate or a polyimide (PI) substrate.

In some examples, as shown in FIG. 5, the display substrate 100 may further include a plurality of first sub-pixels 2 disposed on a side of the substrate 1. The plurality of first sub-pixels 2 include, for example, at least one of red sub-pixels, green sub-pixels, blue sub-pixels and white sub-pixels.

For example, the plurality of first sub-pixels 2 are located at the plurality of first sub-pixel regions P1, respectively. For example, the plurality of first sub-pixels 2 and the first sub-pixel regions P1 are arranged in one-to-one correspondence.

Figure 8A:
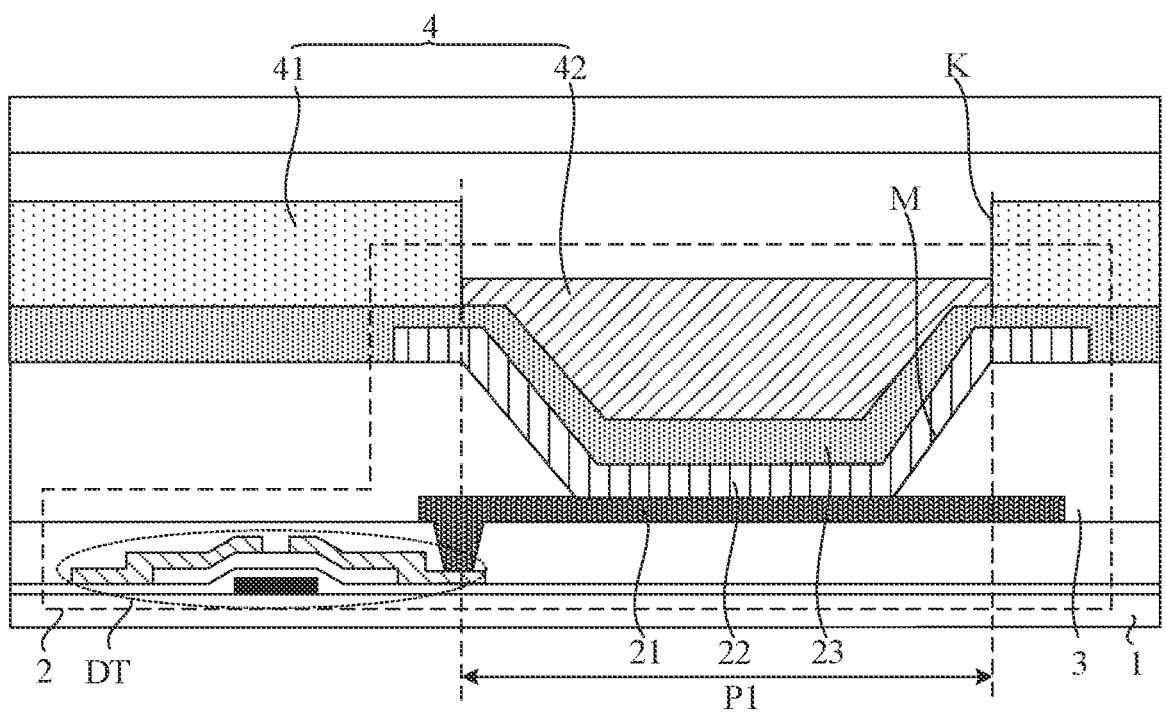
FIG. 8a is a partial schematic diagram of the structure shown in FIG. 7.
Figure 8B:
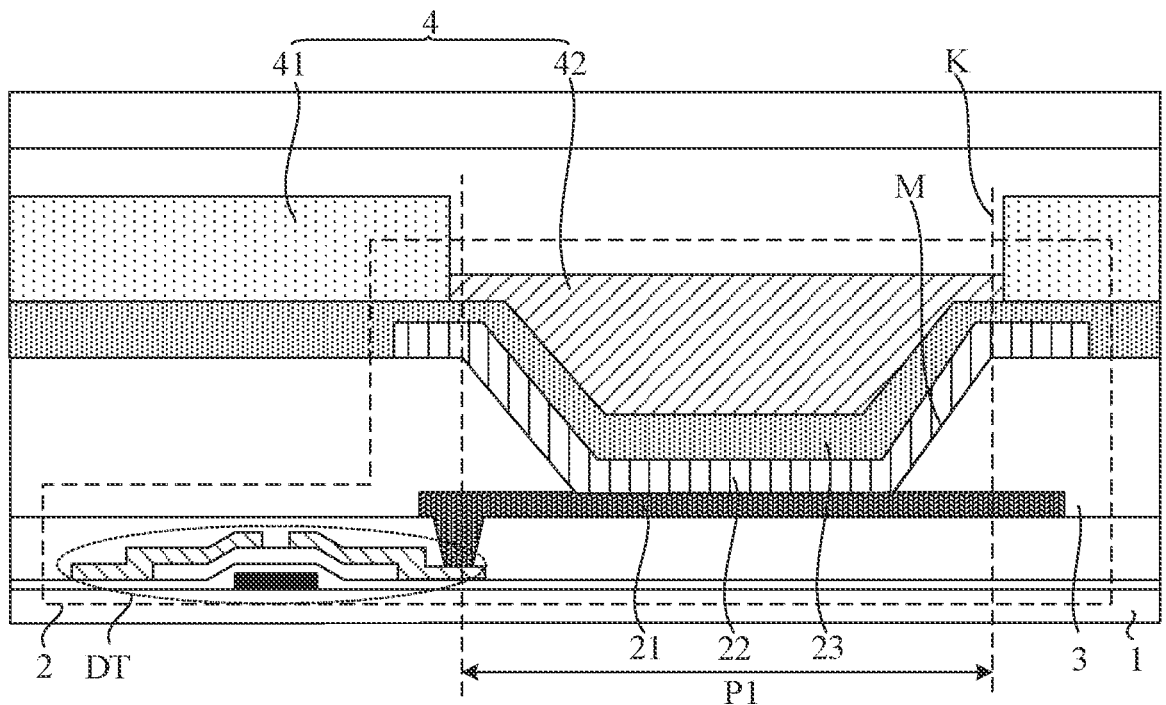
FIG. 8b is another partial schematic diagram of the structure shown in FIG. 7.
Figure 9:
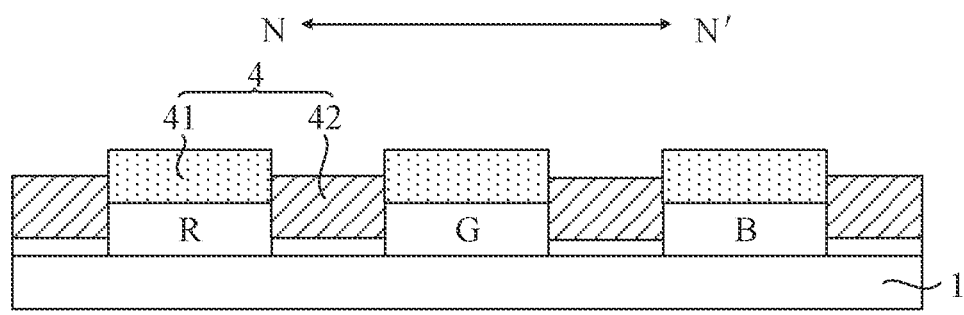
FIG. 9 is a cross-sectional view of the display substrate shown in FIG. 6 taken along the N-N' direction.

For example, as shown in FIGS. 8*a* and 8*b*, the first sub-pixel 2 includes a pixel driving circuit, and a first anode 21, a first light-emitting layer 22 and a first cathode 23 that are stacked in sequence. The first cathode 23 is farther from the substrate 1 than the first anode 21. First cathodes 23 in the plurality of first sub-pixels 2 may be connected to each other to be of an integrative structure.

As shown in FIGS. 8*a* and 8*b*, the display substrate 100 may further include a pixel defining layer 3 disposed between first anodes 21 and first light-emitting layers 22 in the plurality of first sub-pixels 2. The pixel defining layer 3 has a plurality of openings M, and at least one portion of each first light-emitting layer 22 is electrically connected to a corresponding first anode 21 through an opening M.

For example, the openings M of the pixel defining layer 3 are used for defining the plurality of first sub-pixel regions P1. The first sub-pixel region P1 is a region defined by an upper opening portion of an opening M of the pixel defining layer 3.

A structure of the pixel driving circuit varies, which is not limited. For example, the pixel driving circuit may have a "6T1C" structure, a "7T1C" structure, a "6T2C" structure or a "7T2C" structure. Here, "T" represents a thin film transistor, a number before "T" represents the number of thin film transistors, "C" represents a storage capacitor, and a number before "C" represents the number of storage capacitors.

The pixel driving circuit in each first sub-pixels 2 is electrically connected to the first anode 21. The thin film transistor electrically connected to the first anode 21 may be a driving transistor DT in the pixel driving circuit, and the driving transistor DT may be electrically connected to the first anode 21 through a via hole in an insulating layer (or a planarization layer).

Figure 7:
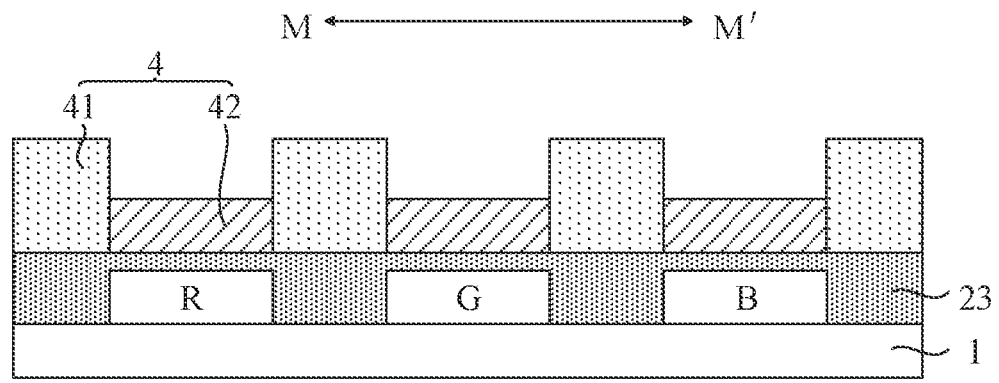
FIG. 7 is a cross-sectional view of the display substrate shown in FIG. 6 taken along the M-M' direction.

In some examples, as shown in FIGS. 7, and 8a and 8b, the display substrate 100 may further include a pattern layer 4 disposed on a side of the plurality of first sub-pixels 2 away from the substrate 1.

Figure 4:
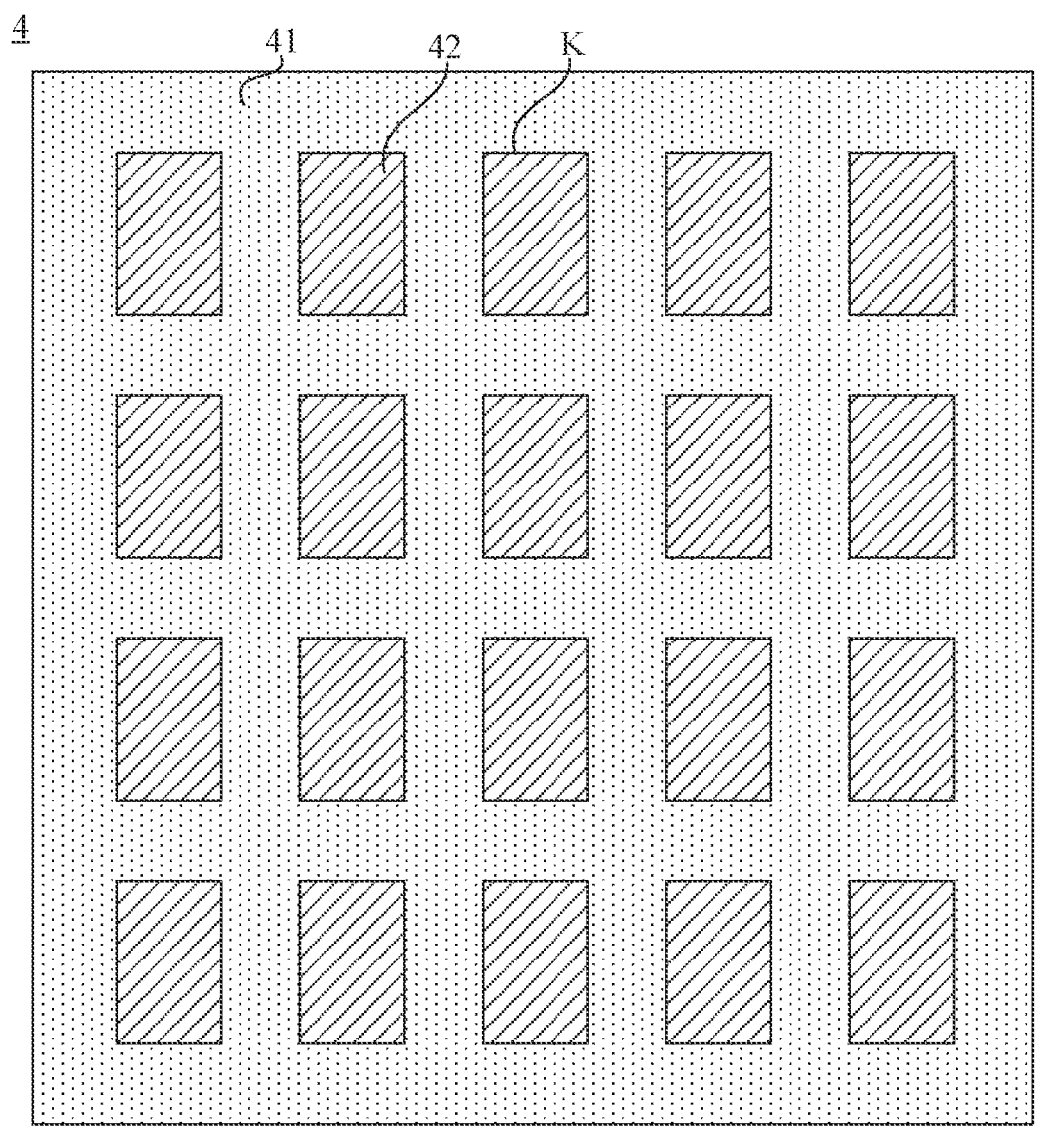
FIG. 4 is a structural diagram of a pattern layer, in accordance with some embodiments of the present disclosure.

For example, as shown in FIG. 4, the pattern layer 4 may include a first pattern 41 and a plurality of second patterns 42. For example, the first pattern 41 may be of an integrative structure.

The first pattern 41 has a plurality of openings K arranged at intervals. The plurality of second patterns 42 are disposed in the plurality of openings K, respectively. For example, the plurality of second patterns 42 are disposed in the plurality of openings K in one-to-one correspondence.

It will be noted that the first pattern 41 is made of a conductive material, and the second patterns 42 are made of a transparent insulating material.

In some examples, as shown in FIG. 8a, boundaries of orthographic projections of part of the plurality of second patterns 42 located in the first region A1 on the substrate 1 respectively coincide with boundaries of the plurality of first sub-pixel regions P1. Alternatively, as shown in FIG. 8b, the boundaries of the plurality of first sub-pixel regions P1 are respectively located within the boundaries of the orthographic projections of the part of the plurality of second patterns 42 located in the first region A1 on the substrate 1. That is, areas of the orthographic projections of the second patterns 42 located in the first region A1 on the substrate 1 are respectively greater than or equal to areas of orthogonal projections of the first sub-pixel regions P1 on the substrate 1.

For example, in the first region A1, a second pattern 42 is located on a side of a first sub-pixel 2 away from the substrate 1. For example, a side surface of the second pattern 42 proximate to the substrate 1 is in direct contact with a side surface of a first cathode 23 in a corresponding first sub-pixel 2 away from the substrate 1.

Since the second patterns 42 are made of the transparent insulating material, and an area of an orthographic projection of each second pattern 42 located in the first region A1 on the substrate 1 is greater than or equal to an area of an orthogonal projection of a corresponding first sub-pixel region P1 on the substrate 1, an electrical performance of the first sub-pixel 2 may be prevented from being affected, and a light extraction efficiency of the first sub-pixel 2 may be prevented from being adversely affected.

Here, in a case where the display region A includes only the first region A1, the plurality of second patterns 42 are all located in the first region A1. In a case where the display region A includes the first region A1 and the second region A2, the part of the plurality of second patterns 42 are located in the first region A1, and another part of the plurality of second patterns 42 are located in the second region A2. The "part of the second patterns 42" and the "another part of the second patterns 42" are quantitative limitations.

In some examples, as shown in FIGS. 8a and 8b, a portion of the first pattern 41 located in the first region A1 is electrically connected to the first cathodes 23.

For example, the first pattern 41 may cover a portion of each of the first cathodes 23 in the plurality of first sub-pixels 2.

Since the plurality of second patterns 42 are respectively located in the plurality of openings K of the first pattern 41, an area of an orthographic projection of each second pattern 42 on the substrate 1 is less than or equal to an area of an orthogonal projection of a corresponding opening K on the substrate 1. In this way, the portion of the first pattern 41 located in the first region A1 does not shield the first sub-pixel region P1, so as to avoid affecting the light extraction efficiency of the first sub-pixel 2. In addition, the portion of the first pattern 41 located in the first region A1 and the first cathode 23 in the first sub-pixel 2 are able to be connected in parallel, which is also beneficial to reducing a sheet resistance of the first cathode 23.

Here, in the case where the display region A includes only the first region A1, the first pattern 41 is entirely located in the first region A1. In the case where the display region A includes the first region A1 and the second region A2, the portion of the first pattern 41 is located in the first region A1, and another portion of the first pattern 41 is located in the second region A2. The "portion of the first pattern 41" and the "another portion of the first pattern 41" are limitations for the entire film layer.

Therefore, in the display substrate 100 provided in some embodiments of the present disclosure, the pattern layer 4 is disposed on the side of the plurality of first sub-pixels 2 away from the substrate 1. The second patterns formed by using the transparent insulating material respectively correspond to the first sub-pixel regions P1, and the areas of the orthographic projections of the part of the second patterns 42 located in the first region A1 on the substrate 1 are each greater than or equal to an area of an orthogonal projection of a corresponding first sub-pixel region P1 on the substrate 1. The first pattern 41 formed by using the conductive material is electrically connected to the first cathode 23 in each first sub-pixel 2, and the portion of the first pattern 41 located in the first region A1 and the first cathode 23 in each first sub-pixel 2 are connected in parallel. In this way, it is possible not only to ensure that the light extraction efficiency of the first sub-pixel 2 is not affected, but also to reduce the sheet resistance of the first cathode 23. In a process of displaying image(s) on the display substrate 100, a phenomenon that a brightness of an end of the display substrate 100 proximate to an integrated circuit is higher than a brightness of an end of the display substrate 100 away from the integrated circuit may be effectively improved, so as to improve a display uniformity and a display quality.

In some embodiments, the material of the first pattern 41 and the material of the second patterns 42 are mutually exclusive.

For example, if the second patterns 42 are manufactured first, the material of the first pattern 41 will not be formed on side surfaces of the second patterns 42 away from the substrate 1 in a subsequent process of manufacturing the first pattern 41 due to the mutual exclusivity of the material of the first pattern 41 and the material of the second patterns 42.

In this way, it is possible not only to avoid that the material of the first pattern 41 is formed in the first sub-pixel region P1 to affect the light extraction efficiency of the first sub-pixel 2, but also to simplify a manufacturing process of the first pattern 41 and a manufacturing process of the display substrate 100.

In some examples, as shown in FIG. 4, the orthographic projection of each second pattern 42 on the substrate 1 is at least partially overlapped with an orthogonal projection of a corresponding opening K on the substrate 1. That is, a side surface of each opening K in the first pattern 41 is at least partially in contact with a side surface of a corresponding second pattern 42.

For example, the side surface of each opening K in first pattern 41 refers to a surface of each opening K opposite to the second pattern 42. The side surface of the second pattern 42 refers to a surface of the second pattern 42 opposite to the first pattern 41 (or a corresponding opening K).

In the second patterns 42, the transparent insulating material may be a lithium quinoline complex. In the first pattern 41, the conductive material may be magnesium.

The lithium quinoline complex and magnesium are commonly used materials in a manufacturing process of an existing display panel. Therefore, additional types of materials are not required to be added in an existing process.

Figure 12:
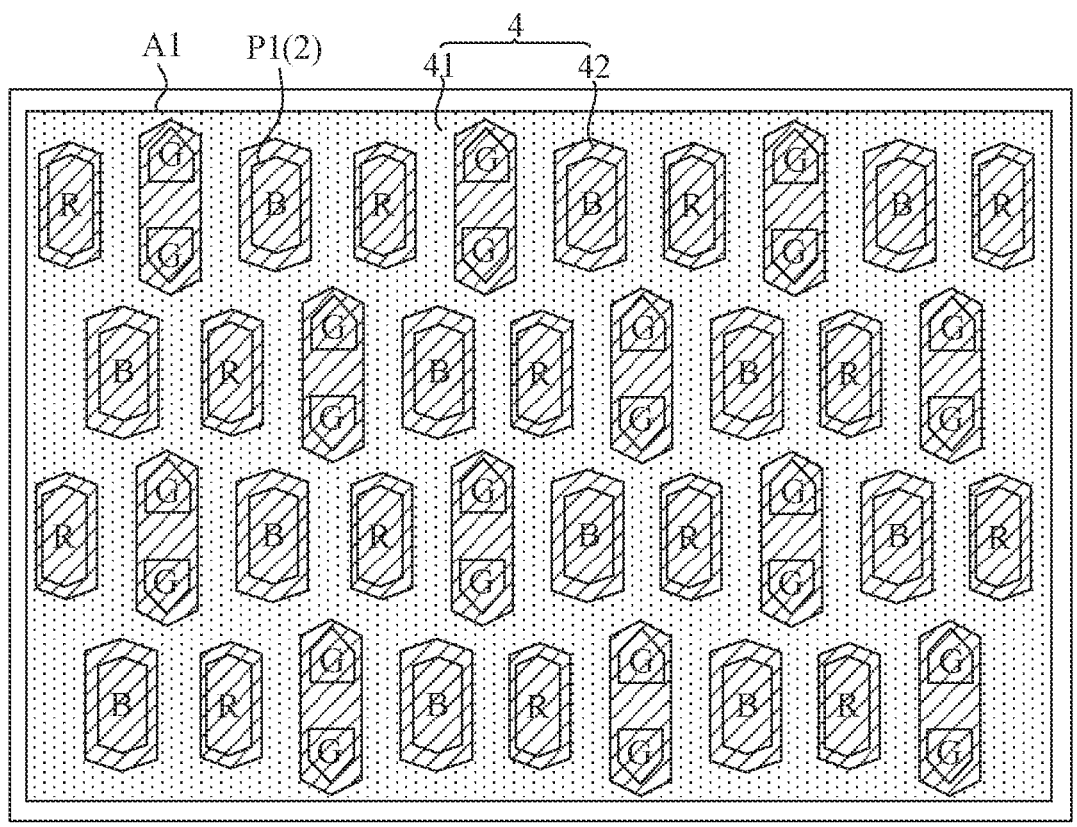
FIG. 12 is a structural diagram of yet another display substrate, in accordance with some embodiments of the present disclosure.

It will be noted that a shape of the orthographic projection of the second pattern 42 on the substrate 1 may vary, and a shape of a corresponding opening K may vary, which may be specifically set according to actual needs. For example, the orthographic projection of the second pattern 42 shown in FIG. 4 on the substrate 1 has a rectangular shape, and a corresponding opening K also has a rectangular shape. Of course, as shown in FIG. 12, the orthographic projection of the second pattern 42 on the substrate 1 and a corresponding opening K may also have other shapes, which are not limited. The shapes of the orthographic projections of the second patterns 42 on the substrate 1 may be the same or different, and the sizes of the orthographic projections of the second patterns 42 on the substrate 1 may be the same or different, which are not limited in the embodiments of the present disclosure.

In some examples, in the pattern layer 4, with respect to the substrate 1, the side surfaces of the plurality of second patterns 42 away from the substrate 1 are lower than a side surface of the first pattern 41 away from the substrate 1.

For example, in the pattern layer 4, the thickness of each of the plurality of second patterns 42 is less than the thickness of the first pattern 41, which is beneficial to reducing an amount of the material of the second patterns 42, so as to reduce a manufacturing cost of the display substrate 100.

The thickness of the second pattern 42 may be about 5 nm. Considering a process error of manufacturing the second patterns 42, the thickness of the second pattern 42 may be changed, slightly increased or decreased.

In some examples, the thickness of the portion of the first pattern 41 located in the first region A1 is greater than or equal to 100 nm.

On this basis, a sheet resistance of a metal structure composed of the portion of the first pattern 41 located in the first region A1 and the first cathode 23 together may be effectively reduced. For example, the sheet resistance may be reduced to at least 1 Ω/□.

The electrical connection between the portion of the first pattern 41 located in the first region A1 and the first cathode 23 in each first sub-pixel 2 varies, which may be set according to actual needs.

In some examples, other film layer(s) (e.g., an insulating layer) may be further disposed between the portion of the first pattern 41 located in the first region A1 and the first cathode 23 in each first sub-pixel 2, and the film layer(s) have via hole(s). The portion of the first pattern 41 located in the first region A1 and the first cathode 23 in each first sub-pixel 2 may be electrically connected through the via hole(s) disposed on the other film layer(s).

In some other examples, as shown in FIGS. 8a and 8b, no other film layer is disposed between the portion of the first pattern 41 located in the first region A1 and the first cathode 23 in each first sub-pixel 2. A side surface of the portion, proximate to the substrate 1, of the first pattern 41 located in the first region A1 is in direct contact with a side surface of the first cathode 23 in each first sub-pixel 2 away from the substrate 1. That is, the portion of the first pattern 41 located in the first region A1 is directly manufactured on the side surface of the first cathode 23, and the electrical connection is realized through the side surfaces of the portion of the first pattern 41 located in the first region A1 and the first cathode 23.

The side surface of the portion, proximate to the substrate 1, of the first pattern 41 located in the first region A1 is in direct contact with the side surface of the first cathode 23 in each first sub-pixel 2 away from the substrate 1, which is beneficial to increasing a contact area between the portion of the first pattern 41 located in the first region A1 and the first cathode 23 in each first sub-pixel 2, so as to realize a better electrical connection therebetween.

In some embodiments, as shown in FIG. 6, the display region A further includes the second region A2 located beside the first region A1. The second region A2 includes a plurality of second sub-pixel regions P2. For example, the plurality of second sub-pixel regions P2 may be arranged in an array.

For example, the "beside" may mean that the first region A1 is located on a side, two sides, or three sides of the second region A2. For example, the first region A1 surrounds the second region A2.

In a case where the display region A includes only the first region A1 and the second region A2, the second region A2 is a region other than the first region A1 in the display region A.

In some examples, a portion of the display substrate 100 located between two adjacent second sub-pixel regions P2 is configured to allow light to pass through the display substrate 100 from a side to another opposite side. That is, the portion of the display substrate 100 located between two adjacent second sub-pixel regions P2 may be in a semi-transparent state.

In this way, in a case where the display substrate 100 is applied to a display apparatus 1000, an optical sensor (e.g., a camera) may be disposed in the second region A2. The optical sensor may be disposed on a side of the substrate 1 away from the pattern layer 4. The external light may pass through the portion of the display substrate 100 located between two adjacent second sub-pixel regions P2 and reach the optical sensor, so that the optical sensor is able to operate normally. This is beneficial to realizing a full-screen of the display apparatus 1000.

Figure 10:
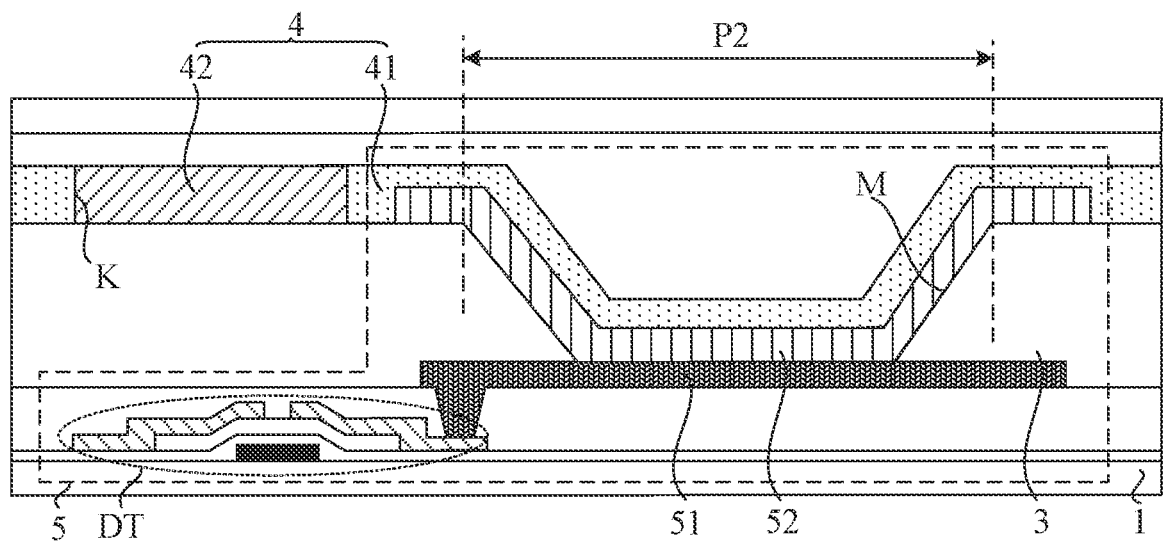
FIG. 10 is a partial schematic diagram of the structure shown in FIG. 9.
Figure 11:
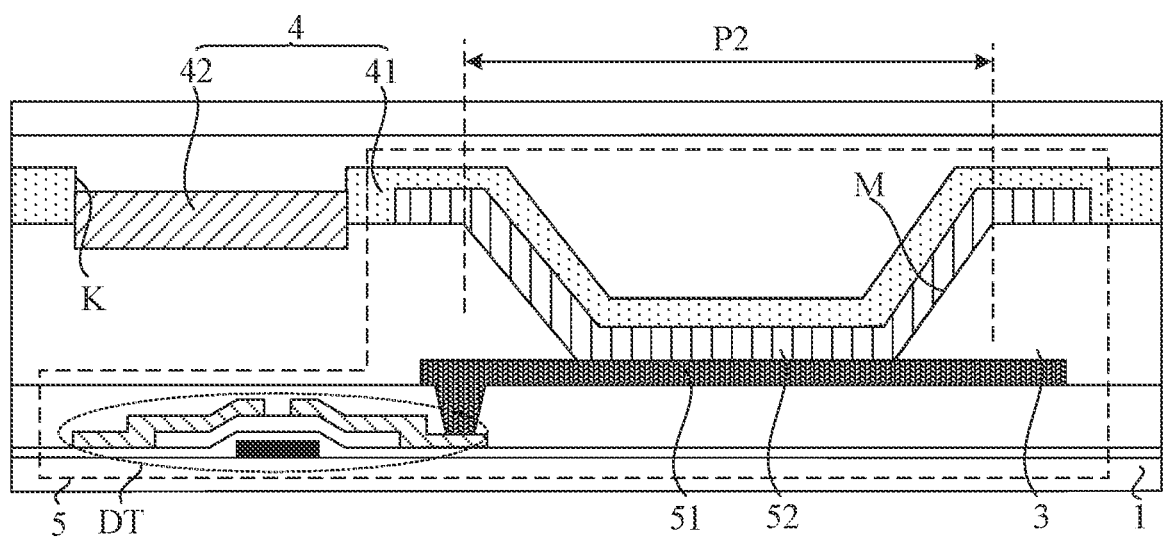
FIG. 11 is another partial schematic diagram of the structure shown in FIG. 9.

In some examples, as shown in FIGS. 6, 10 and 11, the display substrate 100 further includes a plurality of second sub-pixels 5 disposed on the side of the substrate 1. The plurality of second sub-pixels 5 are located at the plurality of second sub-pixel regions P2, respectively. The plurality of second sub-pixels 2 include, for example, at least one of red sub-pixels, green sub-pixels, blue sub-pixels and white sub-pixels.

For example, as shown in FIGS. 10 and 11, the second sub-pixel 5 includes a pixel driving circuit, and a second anode 51 and a second light-emitting layer 52 that are stacked in sequence. The second light-emitting layer 52 is farther from the substrate 1 than the second anode 51. The pixel driving circuit in the second sub-pixel 5 may have the same structure as the pixel driving circuit in the first sub-pixel 2.

It will be noted that the pixel defining layer 3 is also located between second anodes 51 and second light-emitting layers 52 in the plurality of second sub-pixels 5. At least one portion of each second light-emitting layer 52 is electrically connected to a corresponding second anode 51 through an opening M. The openings M of the pixel defining layer 3 are also used for defining the plurality of second sub-pixel regions P2. The second sub-pixel region P2 is a region defined by an upper opening portion of an opening M of the pixel defining layer 3.

For example, as shown in FIGS. 10 and 11, boundaries of the plurality of second sub-pixel regions P2 are located within an orthographic projection of a portion of the first pattern 41 located in the second region A2 on the substrate 1, and each second light-emitting layer 52 is electrically connected to the portion of the first pattern 41 located in the second region A2. Orthographic projections of part of the plurality of second patterns 42 located in the second region A2 on the substrate 1 are non-overlapped with the boundaries of the plurality of second sub-pixel regions P2.

That is, the portion of the first pattern 41 located in the second region A2 covers the second light-emitting layer 52 in each second sub-pixel 5. The part of the second patterns 42 located in the second region A2 are located in a portion of the second region A2 other than the second sub-pixel regions P2.

Since the second patterns 42 are formed by using the transparent insulating material, and the second patterns 42 located in the second region A2 are disposed in the portion of the second region A2 other than the second sub-pixel regions P2, a light transmittance of a portion of the display substrate 100 located in the second region A2 may be prevented from being affected.

For example, a shape of the orthographic projection of the second pattern 42 located in the second region A2 on the substrate 1 varies, which may be set according to actual needs.

Figure 13:
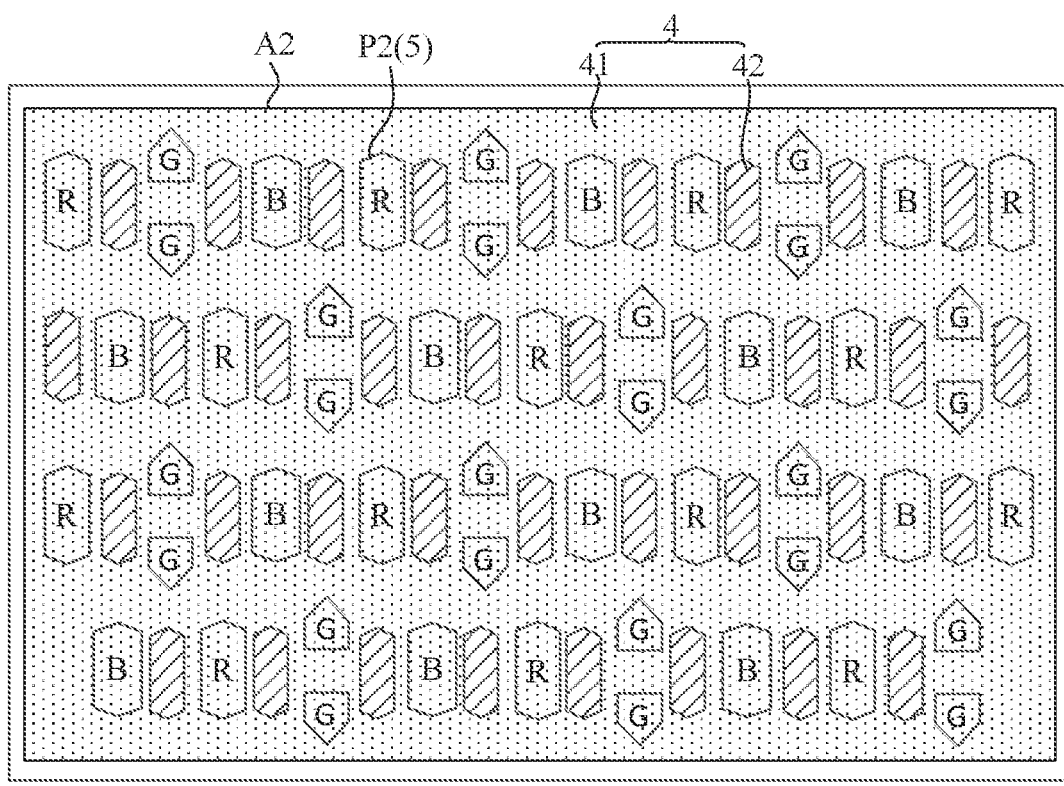
FIG. 13 is a structural diagram of yet another display substrate, in accordance with some embodiments of the present disclosure.

For example, the orthographic projection of the second pattern 42 located in the second region A2 on the substrate 1 may have a hexagonal shape as shown in FIG. 13, and each second pattern 42 located in the second region A2 is located between two adjacent second sub-pixels 5. Of course, the orthographic projection of the second pattern 42 located in the second region A2 on the substrate 1 may have a strip shape, and each second pattern 42 located in the second region A2 may be located between two adjacent rows or columns of second sub-pixels 5. Alternatively, the orthographic projection of the second pattern 42 located in the second region A2 on the substrate 1 may have a grid shape, and the second pattern 42 is adjacent to second sub-pixels 5.

By limiting the shape of the orthographic projection of the second pattern 42 located in the second region A2 on the substrate 1 and a positional relationship of the orthographic projection of the second pattern 42 located in the second region A2 on the substrate 1 and the second sub-pixels 5, it is possible to ensure that the portion of the first pattern 41 located in the second region A2 is a continuous thin film, and the orthographic projection of the second pattern 42 located in the second region A2 on the substrate 1 has a large area, so as to ensure the light transmittance of the portion of the display substrate 100 located in the second region A2.

In some examples, as shown in FIGS. 10 and 11, a side surface of the portion, proximate to the substrate 1, of the first pattern 41 located in the second region A2 is in direct contact with a side surface of each second light-emitting layer 52 away from the substrate 1. The portion of the first pattern 41 located in the second region A2 serves as a second cathode in each second sub-pixel 5.

That is, no other thin film is disposed between the portion of the first pattern 41 located in the second region A2 and the second light-emitting layers 52 in each second sub-pixel 5.

It will be noted that in the related art, in order to realize a full-screen, an optical sensor is required to be disposed on a side of the electroluminescent display panel facing away from a light exit surface of the electroluminescent display panel. Thus, the external light needs to pass through the electroluminescent display panel and reach the optical sensor. On this basis, the cathodes in sub-pixels in the electroluminescent display panel are formed into the whole layer by evaporation. In this way, the cathodes formed into the whole layer by evaporation cause most of light reaching the electroluminescent display panel from the outside to be lost when the light reaches the optical sensor.

Based on the above, in the display substrate 100 provided in some embodiments of the present disclosure, the portion of the first pattern 41 located in the second region A2 is electrically connected to the second light-emitting layer 52 in each second sub-pixel 5, so that the portion of the first pattern 41 located in the second region A2 serves as the second cathode of each second sub-pixel 5. Moreover, the part of the plurality of second patterns 42 located in the second region A2 are each disposed in a region between two adjacent second sub-pixel regions P2, and the second patterns 42 are in a transparent state. In this way, it is beneficial to increasing the light transmittance of the portion of the display substrate 100 located in the second region A2. In a case where the display substrate 100 is applied to the display apparatus 1000, and the display apparatus 1000 further includes an optical sensor disposed in the second region A2, more light may pass through the display substrate 100 from the outside and reach the optical sensor.

It is verified that by using the above arrangement provided in the embodiments of the present disclosure, a transmittance of the display substrate 100 for a visible light band may be increased by 20% or more, and a transmittance of the display substrate 100 for an infrared light band may be increased by 100% or more.

In some examples, the thickness of the portion of the first pattern 41 located in the second region A2 is in a range of 10 nm to 15 nm, inclusive. For example, the thickness of the portion of the first pattern 41 located in the second region A2 may be 10 nm, 11 nm, 12.5 nm, 13.7 nm, or 15 nm.

After the portion of the first pattern 41 located in the second region A2 serves as the second cathode in each second sub-pixel 5, the thickness of the portion of the first pattern 41 located in the second region A2 is set into the above range, which may ensure that light emitted from the second light-emitting layer 52 in each second sub-pixel 5 is able to pass through the portion of the first pattern 41 located in the second region A2, thereby ensuring that the second sub-pixels 5 are able to operate normally to display image(s).

In some examples, as shown in FIG. 11, a plurality of grooves are provided in a portion of the pixel defining layer 3 located in the second region A2. The second patterns 42 located in the second region A2 may be located in the plurality of grooves, respectively. A side surface of the second pattern 42 located in the second region A2 is at least partially in contact with a side surface of an opening of the first pattern 41 located in the second region A2.

Figure 14:
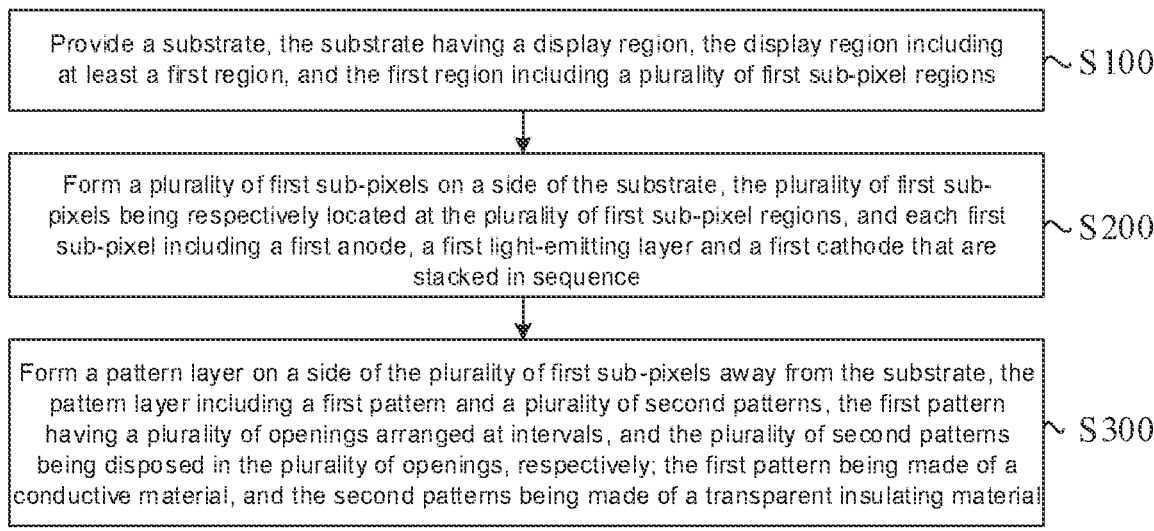
FIG. 14 is a flow diagram of a manufacturing method of a display substrate in accordance with some embodiments of the present disclosure.

Some embodiments of the present disclosure provide a manufacturing method of a display substrate. As shown in FIG. 14, the manufacturing method includes S100 to S300.

In S100, a substrate 1 is provided. The substrate 1 has a display region A. The display region A includes at least a first region A1, and the first region A1 includes a plurality of first sub-pixel regions P1.

For example, a type of the substrate 1, an arrangement of the first region A1, and an arrangement of the first sub-pixel region P1 may be the same as those in some of the above embodiments, which may refer to the description in some of the above embodiments, and will not be repeated here.

In S200, a plurality of first sub-pixels 2 are formed on a side of the substrate 1. The plurality of first sub-pixels 2 are located at the plurality of first sub-pixel regions P1, respectively. Each first sub-pixel 2 includes a first anode 21, a first light-emitting layer 22 and a first cathode 23 that are stacked in sequence.

For example, the first anodes 21 in the first sub-pixels 2 may be manufactured by using a photolithography process, the first light-emitting layers 22 in the first sub-pixels 2 may be manufactured by using an evaporation process or an inkjet printing process, and the first cathodes 23 in the first sub-pixels 2 may be formed by using an evaporation process.

For example, the first cathodes 23 in the first sub-pixels 2 are connected to each other to be of an integrative structure.

It will be noted that in a case where the display region A further includes a second region A2, S200 further includes: forming a plurality of second sub-pixels 5 on the side of the substrate 1. The plurality of second sub-pixels 5 are located at a plurality of second sub-pixel regions P2, respectively. The first anodes 21 in the first sub-pixels 2 and second anodes 51 in the second sub-pixels 5 are arranged in a same layer, and the first light-emitting layers 22 in the first sub-pixels 2 and second light-emitting layers 52 in the second sub-pixels 5 are arranged in a same layer.

Herein, the "same layer" means that a film layer for forming a specific pattern is formed by the same film forming process, and then is patterned by one patterning process using the same mask to form a layer structure. Depending on the different specific patterns, the same patterning process may include several exposure, development or etching processes, the specific patterns in the formed layer structure may be continuous or discontinuous, and these specific patterns may also be at different heights or have different thicknesses.

Figure 18A:
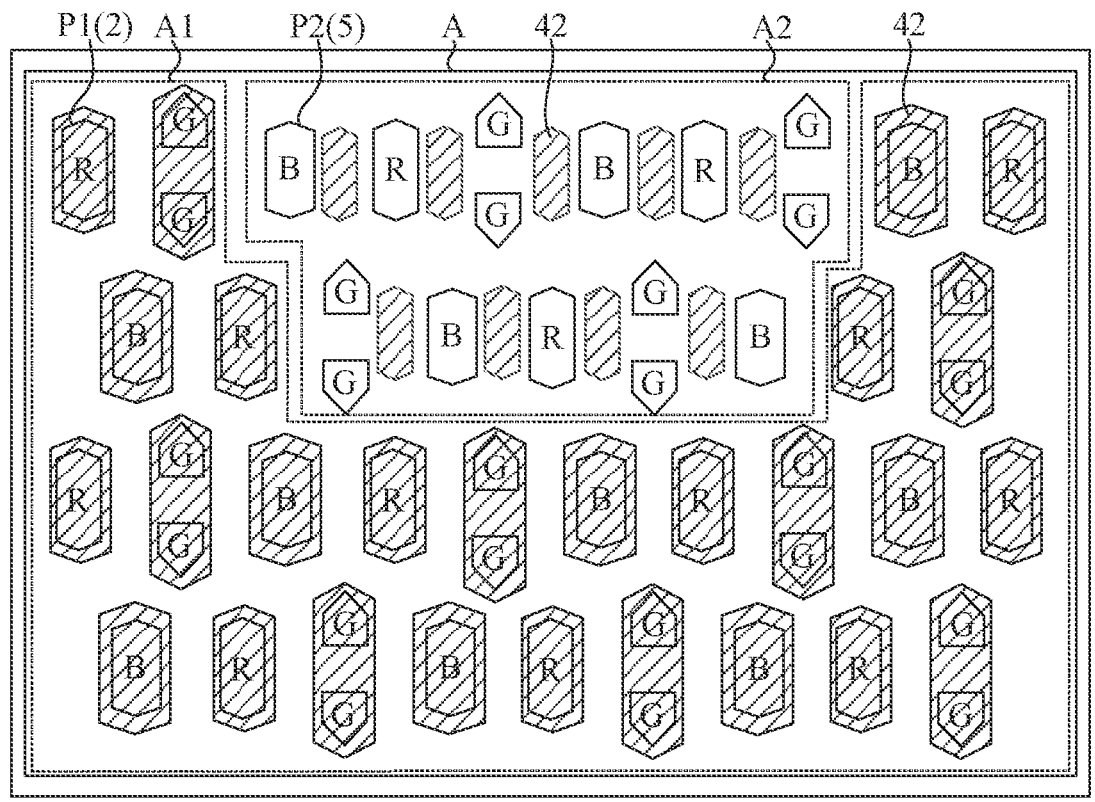
FIGS. 18a and 18b are diagrams showing steps of manufacturing a pattern layer in S300 of the flow diagram shown in FIG. 14.
Figure 18B:
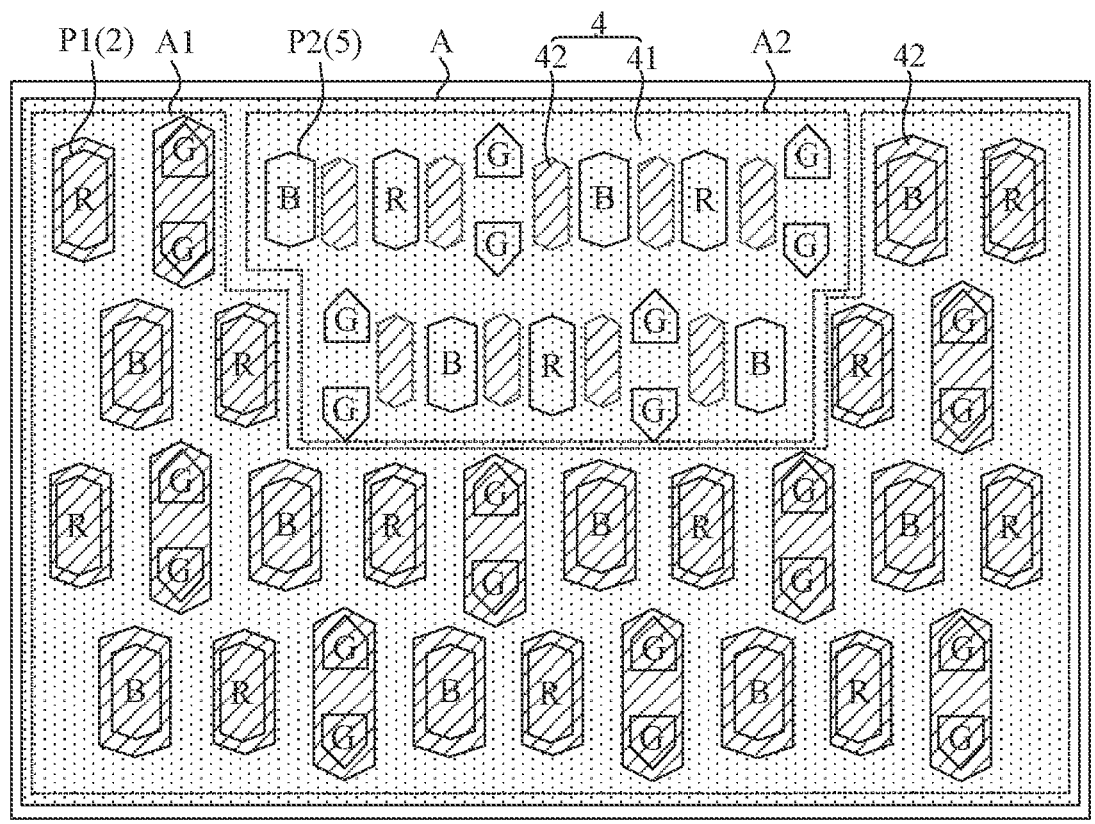

In S300, as shown in FIG. 18b, a pattern layer 4 is formed on a side of the plurality of first sub-pixels 2 away from the substrate 1. The pattern layer 4 includes a first pattern 41 and a plurality of second patterns 42. The first pattern 41 has a plurality of openings K arranged at intervals. The plurality of second patterns 42 are disposed in the plurality of openings K, respectively. The first pattern 41 is made of a conductive material, and the second patterns 42 are made of a transparent insulating material.

Structures of the pattern layer 4, the first pattern 41 and the second patterns 42 may refer to the descriptions in some of the above embodiments, and will not be repeated here.

Figure 15:
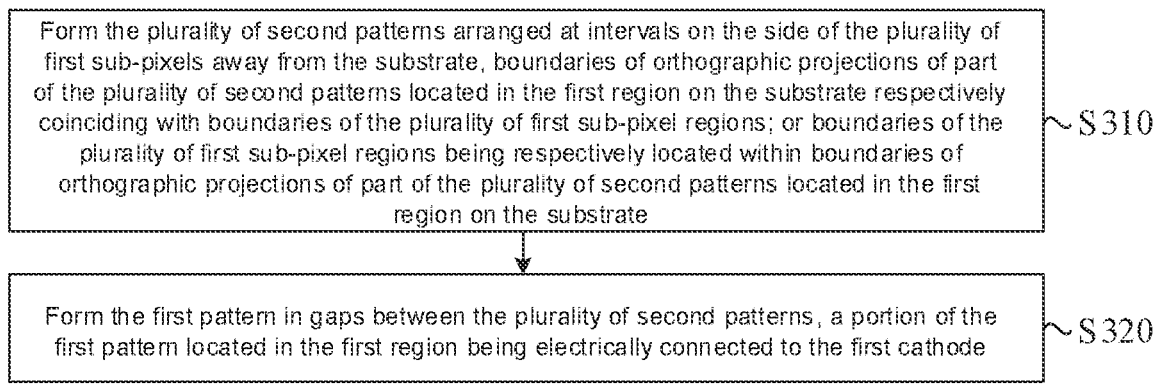
FIG. 15 is a flow diagram of S300 of the flow diagram shown in FIG. 14.

In some examples, as shown in FIG. 15, in S300, forming the pattern layer 4 on the side of the plurality of first sub-pixels 2 away from the substrate 1, includes S310 and S320.

In S310, as shown in FIG. 18a, the plurality of second patterns 42 arranged at intervals are formed on the side of the plurality of first sub-pixels 2 away from the substrate 1. Boundaries of orthographic projections of part of the plurality of second patterns 42 located in the first region A1 on the substrate 1 respectively coincide with boundaries of the plurality of first sub-pixel regions P1. Alternatively, the boundaries of the plurality of first sub-pixel regions P1 are respectively located within the boundaries of the orthographic projections of the part of the plurality of second patterns 42 located in the first region A1 on the substrate 1.

It will be noted that as shown in FIG. 18a, in the case where the display region A further includes the second region A2, part of the plurality of second patterns 42 may be located in the second region A2. The second pattern 42 located in the second region A2 is disposed between two adjacent second sub-pixel regions P2, and orthographic projections of the second patterns 42 located in the second region A2 on the substrate 1 are non-overlapped with boundaries of the plurality of second sub-pixel regions P2.

Figure 16:
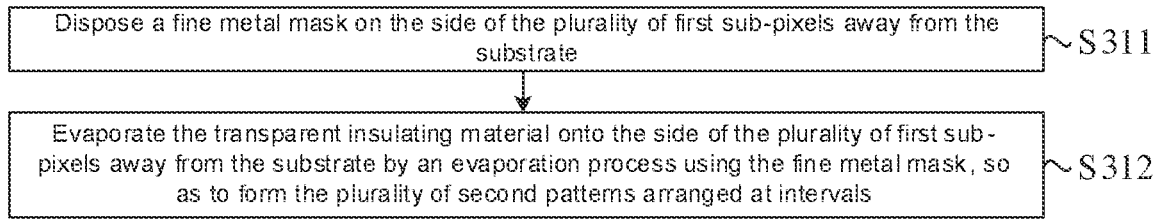
FIG. 16 is a flow diagram of S310 of the flow diagram shown in FIG. 15.

For example, as shown in FIG. 16, in S310, forming the plurality of second patterns 42 arranged at intervals on the side of the plurality of first sub-pixels 2 away from the substrate 1, includes S311 and S312.

In S311, a fine metal mask (FMM) is disposed on the side of the plurality of first sub-pixels 2 away from the substrate 1.

For example, the FMM has a plurality of patterns. Shapes of the plurality of patterns are respectively the same as shapes of the second patterns 42 to be formed, and arrangement positions of the plurality of patterns are respectively the same as arrangement positions of the second patterns 42 to be formed.

In S312, as shown in FIG. 18a, the transparent insulating material is evaporated onto the side of the plurality of first sub-pixels 2 away from the substrate 1 by an evaporation process using the fine metal mask, so as to form the plurality of second patterns 42 arranged at intervals.

For example, the transparent insulating material may be a lithium quinoline complex. The second patterns 42 with desired shapes and positions may be directly formed by evaporating the transparent insulating material using the evaporation process, which is beneficial to simplifying the manufacturing process of the display substrate 100.

In S320, as shown in FIG. 18b, the first pattern 41 is formed in gaps between the plurality of second patterns 42. A portion of the first pattern 41 located in the first region A1 is electrically connected to the first cathodes 23.

It will be noted that in the case where the display region A further includes the second region A2, part of the plurality of second patterns 42 may be located in the second region A2. Boundaries of the second sub-pixel regions P2 are located within an orthographic projection of a portion of the first pattern 41 located in the second region A2 on the substrate 1, and each second light-emitting layer 52 is electrically connected to the portion of the first pattern 41 located in the second region A2.

Figure 17:
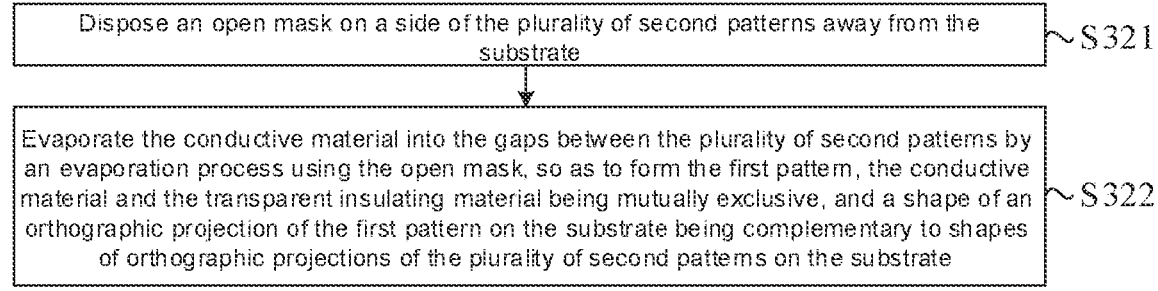
FIG. 17 is a flow diagram of S320 of the flow diagram shown in FIG. 15.

For example, as shown in FIG. 17, in S320, forming the first pattern 41 in the gaps between the plurality of second patterns 42, includes S321 and S322.

In S321, an open mask is disposed on a side of the plurality of second patterns 42 away from the substrate 1.

For example, the open mask has a pattern, and a shape and arrangement position of the pattern are respectively the same as a shape and arrangement position of at least one portion of the first pattern 41 to be formed.

In S322, as shown in FIG. 18b, the conductive material is evaporated into the gaps between the plurality of second patterns 42 by an evaporation process using the open mask, so as to form the first pattern 41. The conductive material and the transparent insulating material are mutually exclusive. A shape of an orthographic projection of the first pattern 41 on the substrate 1 is complementary to shapes of orthographic projections of the plurality of second patterns 42 on the substrate 1.

For example, the conductive material may be magnesium. Magnesium and the lithium quinoline complex are mutually exclusive.

In a process of forming the first pattern 41 by evaporating the conductive material through the open mask, the conductive material is formed between any two adjacent second patterns 42, and the conductive materials located between any two adjacent second patterns 42 are connected to each other to be of an integrative structure. After the first pattern 41 is formed, the plurality of openings K may be spontaneously formed in the first pattern 41, and a second pattern 42 is located in an opening K.

Since the material of the first pattern 41 and the material of the second patterns 42 are mutually exclusive, in a process of evaporating the conductive material, the conductive material may be prevented from being formed on side surfaces of the second patterns 42 away from the substrate 1.

It will be noted that in the case where the display region A further includes the second region A2, the portion of the first pattern 41 located in the second region A2 serves as a second cathode in each second sub-pixel 5. In order to ensure a light extraction efficiency of each second sub-pixel 5, the thickness of the portion of the first pattern 41 located in the second region A2 is small. That is, the thickness (e.g., 100 nm) of the portion of the first pattern 41 located in the first region A1 and the thickness (e.g., 15 nm) of the portion of the first pattern 41 located in the second region A2 are different, and have a large difference therebetween.

Therefore, in the process of forming the first pattern 41, a thin film with a thickness of 15 nm may be formed in the first region A1 and the second region A2 by evaporation, and then the evaporation of the conductive material may be continued in the first region A1, so that the thickness of the portion of the first pattern 41 located in the first region A1 is 100 nm.

Beneficial effects that may be realized by the manufacturing method of the display substrate provided in some embodiments of the present disclosure are the same as the beneficial effects that may be realized by the display substrate 100 provided in some of the above embodiments, and will not be repeated here.

A person of ordinary skill in the art will understand that all or part of the steps in the above method embodiments may be implemented by hardware(s) related to program instructions. The program instructions may be stored in a computer-readable storage medium, and when the program instructions executed, the steps included in the above method embodiments are performed. The computer-readable storage medium includes various media capable of storing program codes, such as a read-only memory (ROM), a random-access memory (RAM), a magnetic disk or an optical disk.

Some embodiments of the present disclosure provide a display apparatus 1000. As shown in FIG. 1, the display apparatus 1000 includes the display substrate 100 in any one of the above embodiments.

Figure 2:
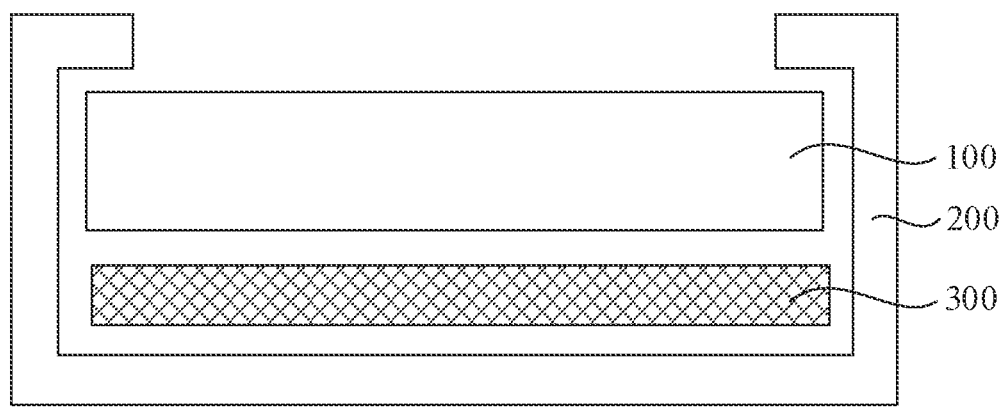
FIG. 2 is a structural diagram of another display apparatus, in accordance with some embodiments of the present disclosure.
Figure 3:
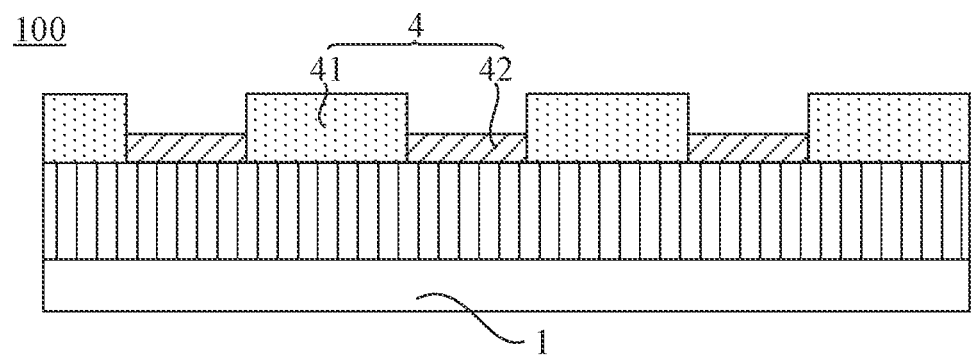
FIG. 3 is a structural diagram of a display substrate, in accordance with some embodiments of the present disclosure.

In some examples, as shown in FIG. 2, the display apparatus 1000 may further include a frame 200, a circuit board 300 and other electronic accessories. Of course, the display apparatus 1000 may further include a cover plate disposed above the display substrate 100, such as a glass cover plate.

A longitudinal section of the frame 200 is, for example, U-shaped. The display substrate 100, the circuit board 300 and other electronic accessories are all disposed in the frame 200, and the circuit board 300 is disposed below the display substrate 100.

It will be noted that the display apparatus 1000 may be an electroluminescent display apparatus, and the electroluminescent display apparatus may be an organic light-emitting diode (OLED) display apparatus or a quantum dot light-emitting diode (QLED) display apparatus.

Beneficial effects that may be realized by the display apparatus 1000 provided in some embodiments of the present disclosure are the same as the beneficial effects that may be realized by the display substrate 100 provided in some of the above embodiments, and will not be repeated here.

In some embodiments, as shown in FIG. 1, in the case where the display region A of the display substrate 100 further includes the second region A2, the display apparatus 1000 further includes at least one optical sensor 400 disposed on a side of the substrate 1 in the display substrate 100 away from the pattern layer 4 in the display substrate 100 and located in the second region A2.

A type of the optical sensor 400 varies, and may be set according to actual needs.

For example, the optical sensor 400 may be a camera, or an infrared sensor.

In some embodiments, the display apparatus 1000 may be any product or component with a display function, such as a mobile phone, a tablet computer, a television, a display, a notebook computer, a digital photo frame, or a navigator.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display region, wherein the display region includes at least a first region, and the first region includes a plurality of first sub-pixel regions; the display substrate comprises:
   a substrate;
   a plurality of first sub-pixels disposed on a side of the substrate and respectively located at the plurality of first sub-pixel regions; each first sub-pixel including a first anode, a first light-emitting layer and a first cathode that are stacked in sequence; and
   a pattern layer disposed on a side of the plurality of first sub-pixels away from the substrate; wherein the pattern layer includes a first pattern and a plurality of second patterns, the first pattern has a plurality of openings arranged at intervals, and the plurality of second patterns are disposed in the plurality of openings, respectively; the first pattern is made of a conductive material, and the second patterns are made of a transparent insulating material; wherein
   boundaries of orthographic projections of part of the plurality of second patterns located in the first region on the substrate respectively coincide with boundaries of the plurality of first sub-pixel regions; or boundaries of the plurality of first sub-pixel regions are respectively located within boundaries of orthographic projections of part of the plurality of second patterns located in the first region on the substrate;

a portion of the first pattern located in the first region is electrically connected to the first cathode; and the second patterns are made of a lithium quinoline complex, and the first pattern is made of magnesium.

2. The display substrate according to claim 1, wherein an orthographic projection of each second pattern on the substrate is at least partially overlapped with an orthogonal projection of a corresponding opening on the substrate.

3. The display substrate according to claim 2, wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

4. The display substrate according to claim 1, wherein the first pattern and the second patterns are mutually exclusive in material.

5. The display substrate according to claim 4, wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

6. The display substrate according to claim 1, wherein a side surface of the portion, proximate to the substrate, of the first pattern located in the first region is in direct contact with a side surface of the first cathode away from the substrate.

7. The display substrate according to claim 6, wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

8. The display substrate according to claim 1, wherein a thickness of the portion of the first pattern located in the first region is greater than or equal to 100 nm.

9. The display substrate according to claim 1, wherein with respect to the substrate, side surfaces of the plurality of second patterns away from the substrate are lower than a side surface of the first pattern away from the substrate.

10. The display substrate according to claim 9, wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

11. The display substrate according to claim 1, wherein a thickness of the plurality of second patterns is about 5 nm.

12. The display substrate according to claim 1, wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

13. A display apparatus comprising the display substrate according to claim 1.

14. The display apparatus according to claim 13, wherein the display region of the display substrate further includes a second region; and the display apparatus further includes at least one optical sensor disposed on a side of the substrate in the display substrate away from the pattern layer in the display substrate and located in the second region.

15. A manufacturing method of a display substrate, comprising:

providing a substrate, wherein the substrate has a display region, the display region includes at least a first region, and the first region includes a plurality of first sub-pixel regions;

forming a plurality of first sub-pixels on a side of the substrate, wherein the plurality of first sub-pixels are respectively located at the plurality of first sub-pixel regions, and each first sub-pixel includes a first anode, a first light-emitting layer and a first cathode that are stacked in sequence; and forming a pattern layer on a side of the plurality of first sub-pixels away from the substrate, wherein the pattern layer includes a first pattern and a plurality of second patterns, the first pattern has a plurality of openings arranged at intervals, and the plurality of second patterns are disposed in the plurality of openings, respectively; the first pattern is made of a conductive material, and the second patterns are made of a transparent insulating material; wherein forming the pattern layer on the side of the plurality of first sub-pixels away from the substrate, includes:

forming the plurality of second patterns arranged at intervals on the side of the plurality of first sub-pixels away from the substrate, wherein boundaries of orthographic projections of part of the plurality of second patterns located in the first region on the substrate respectively coincide with boundaries of the plurality of first sub-pixel regions; or boundaries of the plurality of first sub-pixel regions are respectively located within boundaries of orthographic projections of part of the plurality of second patterns located in the first region on the substrate; and forming the first pattern in gaps between the plurality of second patterns, wherein a portion of the first pattern located in the first region is electrically connected to the first cathode; wherein forming the plurality of second patterns arranged at intervals on the side of the plurality of first sub-pixels away from the substrate, includes:

disposing a fine metal mask on the side of the plurality of first sub-pixels away from the substrate; and evaporating the transparent insulating material onto the side of the plurality of first sub-pixels away from the substrate by an evaporation process using the fine metal mask, so as to form the plurality of second patterns arranged at intervals; and forming the first pattern in the gaps between the plurality of second patterns, includes:

disposing an open mask on a side of the plurality of second patterns away from the substrate; and evaporating the conductive material into the gaps between the plurality of second patterns by an evaporation process using the open mask, so as to form the first pattern, wherein the conductive material and the transparent insulating material are mutually exclusive, and a shape of an orthographic projection of the first pattern on the substrate is complementary to shapes of orthographic projections of the plurality of second patterns on the substrate.

16. A display substrate having a display region, wherein the display region includes at least a first region, and the first region includes a plurality of first sub-pixel regions; the display substrate comprises:

a substrate;

a plurality of first sub-pixels disposed on a side of the substrate and respectively located at the plurality of first sub-pixel regions; each first sub-pixel including a first anode, a first light-emitting layer and a first cathode that are stacked in sequence; and a pattern layer disposed on a side of the plurality of first sub-pixels away from the substrate; wherein the pattern layer includes a first pattern and a plurality of second patterns, the first pattern has a plurality of openings arranged at intervals, and the plurality of second patterns are disposed in the plurality of openings, respectively; the first pattern is made of a conductive material, and the second patterns are made of a transparent insulating material; wherein boundaries of orthographic projections of part of the plurality of second patterns located in the first region on the substrate respectively coincide with boundaries of the plurality of first sub-pixel regions; or boundaries of the plurality of first sub-pixel regions are respectively located within boundaries of orthographic projections of part of the plurality of second patterns located in the first region on the substrate; and a portion of the first pattern located in the first region is electrically connected to the first cathode;

wherein the display region further includes a second region located beside the first region, and the second region includes a plurality of second sub-pixel regions; and a portion of the display substrate located between two adjacent second sub-pixel regions is configured to allow light to pass through the display substrate from a side to another opposite side.

17. The display substrate according to claim 16, further comprising a plurality of second sub-pixels disposed on the side of the substrate and respectively located at the plurality of second sub-pixel regions; each second sub-pixel including a second anode and a second light-emitting layer that are stacked in sequence; wherein boundaries of the plurality of second sub-pixel regions are located within an orthographic projection of a portion of the first pattern located in the second region on the substrate, and the second light-emitting layer is electrically connected to the portion of the first pattern located in the second region; and orthographic projections of part of the plurality of second patterns located in the second region on the substrate are non-overlapped with the boundaries of the plurality of second sub-pixel regions.

18. The display substrate according to claim 17, wherein a side surface of the portion, proximate to the substrate, of the first pattern located in the second region is in direct contact with a side surface of the second light-emitting layer away from the substrate; and the portion of the first pattern located in the second region serves as a second cathode in each second sub-pixel.

19. The display substrate according to claim 16, wherein a thickness of a portion of the first pattern located in the second region is in a range of 10 nm to 15 nm, inclusive.

* * * * *